United States Patent
Choe (10) Patent No.: US 6,639,429 B2
(45) Date of Patent: Oct. 28, 2003

(54) METHOD FOR CLOCK CONTROL OF HALF-RAIL DIFFERENTIAL LOGIC

(75) Inventor: Swee Yew Choe, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/278,355

(22) Filed: Oct. 22, 2002

(65) Prior Publication Data

US 2003/0076133 A1 Apr. 24, 2003

Related U.S. Application Data

(62) Division of application No. 09/927,566, filed on Aug. 9, 2001.

(51) Int. Cl.[7] ............................................. H03K 19/096
(52) U.S. Cl. ........................... 326/95; 326/93; 326/113
(58) Field of Search ............................. 326/93, 95, 96, 326/97, 98, 112, 119, 121, 113; 327/437

(56) References Cited

U.S. PATENT DOCUMENTS

| | | | | |
|---|---|---|---|---|
| 4,247,791 A | * | 1/1981 | Rovell | 307/355 |
| 5,859,548 A | * | 1/1999 | Kong | 326/113 |
| 6,028,454 A | | 2/2000 | Elmasry et al. | 326/115 |
| 6,211,704 B1 | * | 4/2001 | Kong | 326/121 |

OTHER PUBLICATIONS

Choe et al., "Dynamic Half Rail Differential Logic for Low Power", IEEE 1997, pp. 1936 to 1939.

Jung et al., "Modular Charge Recycling Pass Transistor Logic (MCRPL)", Electronics Letters, 2nd Mar. 2000 vol. 36 No. 5, Mar. 2, 2000, pp. 404 to 405.

Kong et al., "Charge Recycling Differential Logic for Low-Power Application", ISSC96 secession 18, IEEE 0–780331962/98, 1998, pp. 302 to 448.

Choe et al., "Half Rail Differential Logic", ISSCC97/Secession 25/Processors and Logic/Paper SP 25.6 IEEE 0–7803–3721–2/97, 1997, pp. 420 to 421, 336 to 337 and 489.

Won et al., "Modified Half Rail Differential Logic for Reduced Internal Logic Swing", IEEE 0–7803–4455–3/98, 1998, pp. II–157 to II–160.

Kong et al., "Charge Recycling Differential Logic (CRDL) for Low–Power Application", IEEE Journal of Solid–State Circuits, vol. 31, No. 9, Sep. 1996, pp. 1267 to 1276.

* cited by examiner

Primary Examiner—Daniel D Chang
(74) Attorney, Agent, or Firm—Gunnison, McKay & Hodgson, L.L.P.; Philip J. McKay (57) ABSTRACT

Clocked half-rail differential logic circuits are activated by a delayed clock. According to the invention, when clocked half-rail differential logic circuits of the invention are cascaded together, a delayed clock is provided for each clocked half-rail differential logic circuit and each delayed clock is timed to at least the delay of the previous clocked half-rail differential logic circuit. Consequently, according to the invention, a delay time is introduced to ensure each clocked half-rail differential logic circuit of the invention is switched or "fired" only after it has received an input from the previous clocked half-rail differential logic circuit stage. According to the invention, this is achieved without the use of complicated control circuitry.

4 Claims, 5 Drawing Sheets

METHOD FOR CLOCK CONTROL OF HALF-RAIL DIFFERENTIAL LOGIC

This application is a divisional application of U.S. patent application Ser. No. 09/927,566 is still pending, entitled "METHOD FOR CLOCK CONTROL OF HALF-RAIL DIFFERENTIAL LOGIC" of Swee Yew Choe, filed on Aug. 9, 2001 and assigned to the Assignee of the present Application, and which is incorporated herein by reference in its entirety.

FIELD OF THE INVENTION

The present invention relates generally to logic circuits and, more particularly, to half-rail logic circuits.

BACKGROUND OF THE INVENTION

With the emergence of an electronics market that stresses portability, compact size, lightweight and the capability for prolonged remote operation, a demand has arisen for low power circuits and systems. This demand has motivated circuit designers to depart from conventional circuit designs and venture into more power efficient alternatives. As part of this effort, half-rail differential logic has emerged as an important design tool for increasing power efficiency.

Figure 1:
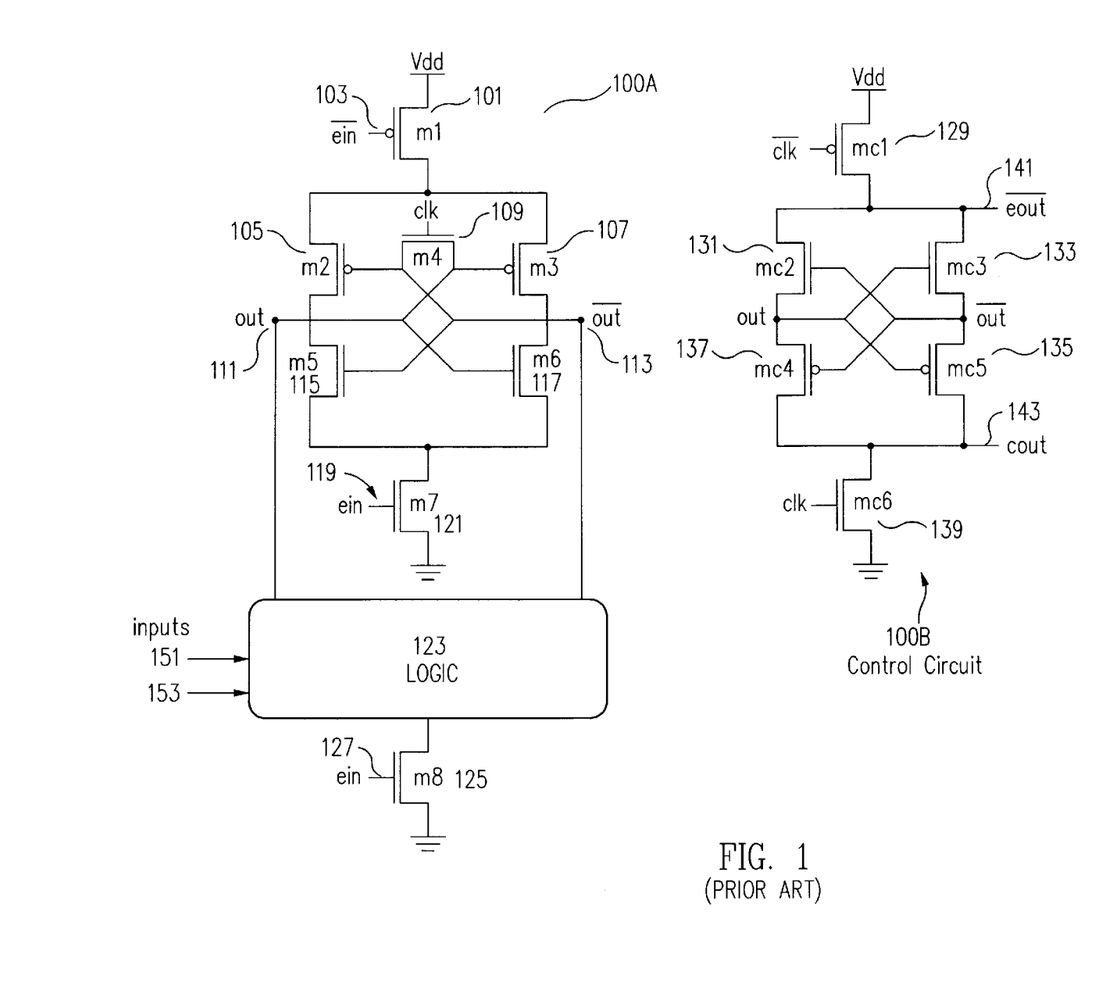
FIG. 1 shows a schematic diagram of a prior art half-rail differential logic circuit and associated prior art control circuit as set forth in FIG. 1 of the 1997 IEEE International Solid-State Circuits Conference Paper ISSC97/SESSION 25/PROCESSORS AND LOGIC/PAPER 25.6.

FIG. 1 shows a prior art half-rail differential logic circuit 100A and associated prior art control circuit 100B as was set forth in FIG. 1 of the 1997 IEEE International Solid-State Circuits Conference Paper ISSC97/SESSION 25/PROCESSORS AND LOGIC/PAPER 25.6 (hereinafter referred to as the ISSC97 PAPER 25.6). ISSC97 PAPER 25.6 is co-authored by the Inventor of the present invention and is incorporated herein, by reference, for all purposes.

As seen in FIG. 1 of the present invention, prior art half-rail differential logic circuit 100A included eight transistors, PFET 101, PFET 105, PFET 107, NFET 109, NFET 115, NFET 117, NFET 121, and NFET 125. Prior art half-rail differential logic circuit 100A also included differential logic 123 with inputs 151 and 153, output 111 and output 113.

As discussed below, prior art half-rail differential logic circuit 100A also required control circuit 100B. Control circuit 100B included six transistors: PFET 129; NFET 131; NFET 133; PFET 137; PFET 135 and NFET 139. Prior art control circuit 100B also included an enable out signal (eout) at terminal 143 and an enable out bar signal ($\overline{eout}$) at terminal 141. According to the prior art, the control signals eout and $\overline{eout}$, at terminals 143 and 141, respectively, were supplied to prior art half-rail differential logic circuit 100A as control signals ein and $\overline{ein}$ as discussed below.

As discussed above, prior art half-rail differential logic circuit 100A required an enable in (ein) signal, coupled to the gate of NFET 121 and NFET 125, and an enable in bar signal ($\overline{ein}$), coupled to the gate of NFET 101. The control signals ein and $\overline{ein}$ were supplied by prior art control circuit 100B from terminals 143 and 141, respectively. When multiple prior art half-rail differential logic circuits 100A were cascaded together, prior art control circuit 100B and control signals ein and $\overline{ein}$ were necessitated to ensure that each prior art half-rail differential logic circuit 100A switched or "fired" only after it had received an input from the previous stage.

Cascading is well known in the art. For a more detailed discussion of the cascading of prior art half-rail differential logic circuits 100A, and the operation of prior art half-rail differential logic circuit 100A and prior art control circuit 100B, the reader is referred to the ISSC97 PAPER 25.6 discussed above. A more detailed discussion of the operation of prior art half-rail differential logic circuit 100A and prior art control circuit 100B is omitted here to avoid detracting from the invention.

As noted above, when multiple prior art half-rail differential logic circuits 100A were cascaded together, each prior art half-rail differential logic circuit 100A required prior art control circuit 100B to ensure that each prior art half-rail differential logic circuit 100A switched or "fired" only after it had received an input from the previous stage. However, prior art control circuit 100B was extremely complex, requiring at least six additional transistors and several circuit lines. Consequently, prior art half-rail differential logic circuit 100A required significant addition components and space. This, in turn, meant that prior art half-rail differential logic circuit 100A required more silicon, a more complex design and more components to potentially fail. In addition, prior art control circuit 100B not only added complexity to prior art half-rail differential logic circuits 100A, but it also loaded the output nodes 111 and 113 of prior art half-rail differential logic circuit 100A and drew current from output nodes 111 and 113 of prior art half-rail differential logic circuit 100A to charge the control signals ein and $\overline{ein}$. In addition, in the prior art, if prior art control circuit 100B were made small, the control signals ein and $\overline{ein}$ were slow, and this slowed down the operation of prior art half-rail differential logic circuit 100A. Consequently, there was pressure to increase the size of prior art control circuit 100B. However, Increasing the size of prior art control circuit 100B to speed up the control signals ein and $\overline{ein}$ also increased the loading on the output nodes 111 and 113 of prior art half-rail differential logic circuit 100A and therefore slowed down the evaluation of logic 123.

What is needed is a method and apparatus for creating half-rail differential logic that does not require the complex control circuitry of prior art half-rail differential logic circuits and is therefore simpler, more space efficient and is more reliable than prior art half-rail differential logic circuits.

SUMMARY OF THE INVENTION

According to the invention, the prior art control circuitry is eliminated. The clocked half-rail differential logic circuit of the invention is instead activated from a delayed clock. According to the invention, when clocked half-rail differential logic circuits of the invention are cascaded together, a delayed clock is provided for each clocked half-rail differential logic circuit of the invention. Each delayed clock is timed to at least the delay of the previous clocked half-rail differential logic circuit. Consequently, according to the invention, a delay time is introduced to ensure each clocked half-rail differential logic circuit of the invention is switched or "fired" only after it has received an input from the previous clocked half-rail differential logic circuit.

According to the invention, clocked half-rail differential logic circuits do not require the significant additional components required in the prior art. This, in turn, means that the clocked half-rail differential logic circuits of the invention require less space, are simpler and have fewer components to potentially fail. In addition, clocked half-rail differential logic circuits of the invention eliminate the loading of the output nodes of the half-rail differential logic circuit since there are no control signals ein and $\overline{ein}$, and therefore no prior art control circuits to draw current from the output nodes to charge the control signals ein and $\overline{ein}$.

Consequently, using the clocked half-rail differential logic circuits of the invention, speed is increased because there is less loading on the output nodes and the clocked half-rail differential logic circuit of the invention can start evaluating once a differential voltage develops between the complementary inputs coming from the previous clocked half-rail differential logic circuit.

In particular, one embodiment of the invention is a cascaded chain of clocked half-rail differential logic circuits. The chain includes a first clocked half-rail differential logic circuit. The first clocked half-rail differential logic circuit includes: a first clocked half-rail differential logic circuit clock input terminal; at least one first clocked half-rail differential logic circuit data input terminal; and at least one first clocked half-rail differential logic circuit data output terminal.

The cascaded chain also includes a second clocked half-rail differential logic circuit. The second clocked half-rail differential logic circuit includes: a second clocked half-rail differential logic circuit clock input terminal; at least one second clocked half-rail differential logic circuit data input terminal; and at least one second clocked half-rail differential logic circuit data output terminal.

According to the invention, the at least one first clocked half-rail differential logic circuit data output terminal is coupled to the at least one second clocked half-rail differential logic circuit data input terminal to form the chain. According to the invention, a first clock signal is coupled to the first clocked half-rail differential logic circuit clock input terminal and a second clock signal is coupled to the second clocked half-rail differential logic circuit clock input terminal. According to the invention, the second clock signal is delayed with respect to the first clock signal by a predetermined delay time.

In one embodiment of the invention, a delay circuit is coupled between the first clocked half-rail differential logic circuit clock input terminal and the second clocked half-rail differential logic circuit clock input terminal to provide the predetermined delay time.

One embodiment of the invention is a clocked half-rail differential logic circuit that includes a clocked half-rail differential logic circuit out terminal and a clocked half-rail differential logic circuit out-not terminal.

The clocked half-rail differential logic circuit also includes a first transistor including a first transistor first flow electrode, a first transistor second flow electrode and a first transistor control electrode. The first transistor first flow electrode is coupled to a first supply voltage.

The clocked half-rail differential logic circuit also includes a second transistor, the second transistor including a second transistor first flow electrode, a second transistor second flow electrode and a second transistor control electrode. The first transistor second flow electrode is coupled to the second transistor first flow electrode and the second transistor second flow electrode is coupled to the clocked half-rail differential logic circuit out terminal.

The clocked half-rail differential logic circuit also includes a third transistor, the third transistor including a third transistor first flow electrode, a third transistor second flow electrode and a third transistor control electrode. The first transistor second flow electrode is coupled to the third transistor first flow electrode and the third transistor second flow electrode is coupled to the clocked half-rail differential logic circuit out-not terminal.

The clocked half-rail differential logic circuit also includes a fourth transistor, the fourth transistor including a fourth transistor first flow electrode, a fourth transistor second flow electrode and a fourth transistor control electrode. The second transistor control electrode is coupled to the fourth transistor first flow electrode and the clocked half-rail differential logic circuit out-not terminal. The third transistor control electrode is coupled to the fourth transistor second flow electrode and the clocked half-rail differential logic circuit out terminal.

The clocked half-rail differential logic circuit also includes a logic block, the logic block including a logic block first input terminal, a logic block second input terminal, a logic block out terminal, a logic block out-not terminal and a logic block fifth terminal. The logic block out terminal is coupled to the clocked half-rail differential logic circuit out terminal and the logic block out-not terminal is coupled to the clocked half-rail differential logic circuit out-not terminal.

The clocked half-rail differential logic circuit also includes a fifth transistor, the fifth transistor including a fifth transistor first flow electrode, a fifth transistor second flow electrode and a fifth transistor control electrode. The fifth transistor first flow electrode is coupled to the logic block fifth terminal and the fifth transistor second flow electrode is coupled to a second supply voltage.

A clock signal is coupled to the fifth transistor control electrode of the fifth transistor of the clocked half-rail differential logic circuit. A clock-not signal is coupled to the first transistor control electrode of the first transistor of the clocked half-rail differential logic circuit and the fourth transistor control electrode of the fourth transistor of the clocked half-rail differential logic circuit.

As discussed in more detail below, the method and apparatus of the invention for creating clocked half-rail differential logic does not require the complex control circuitry of prior art half-rail differential logic circuits and is therefore simpler, saves space and is more reliable than prior art half-rail differential logic circuits. As a result, the clocked half-rail differential logic circuits of the invention are better suited to the present electronics market that stresses portability, compact size, lightweight and the capability for prolonged remote operation.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

Figure 2:
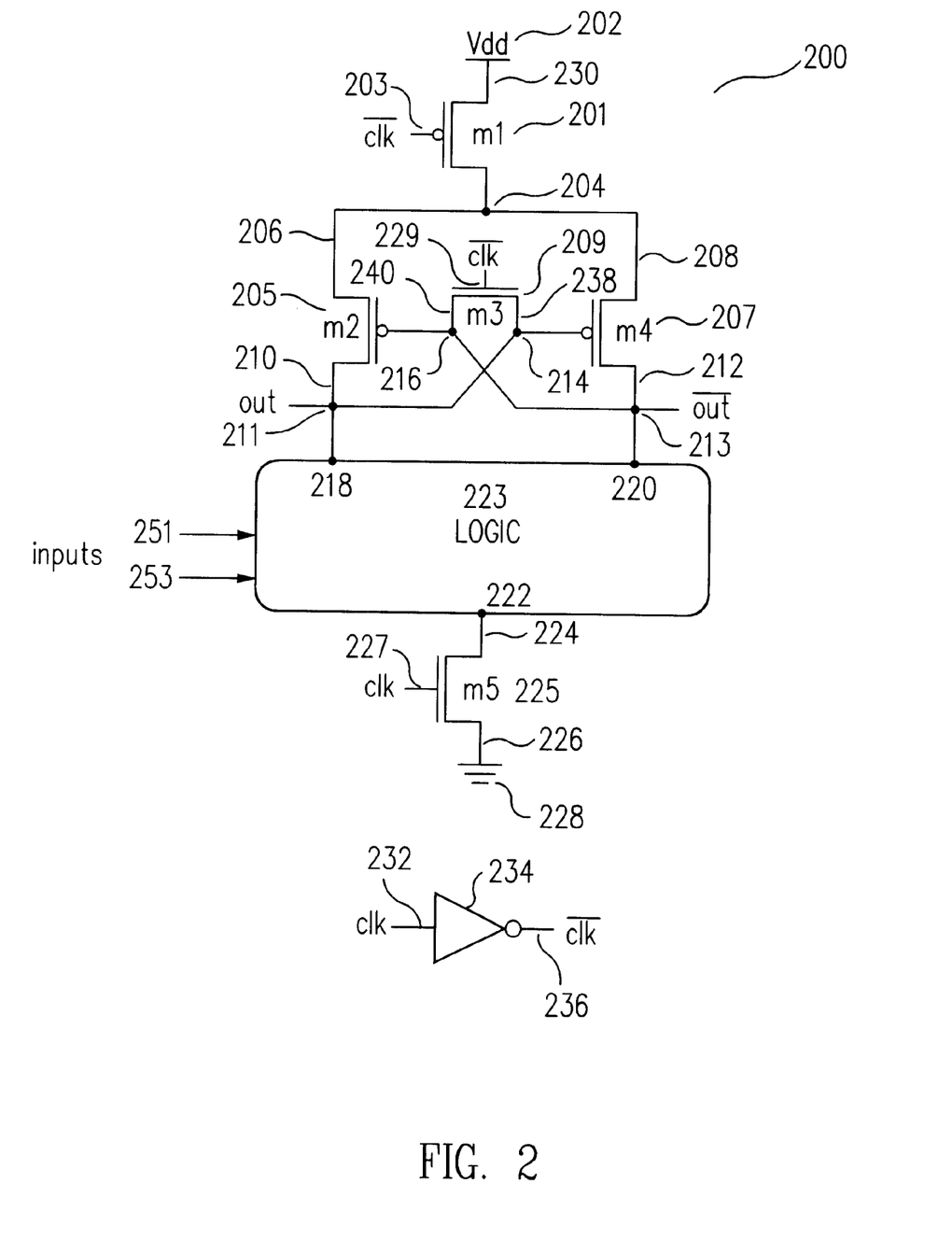
FIG. 2 shows a schematic diagram of one embodiment of a clocked half-rail differential logic circuit designed according to the principles of the present invention.
Figure 3:
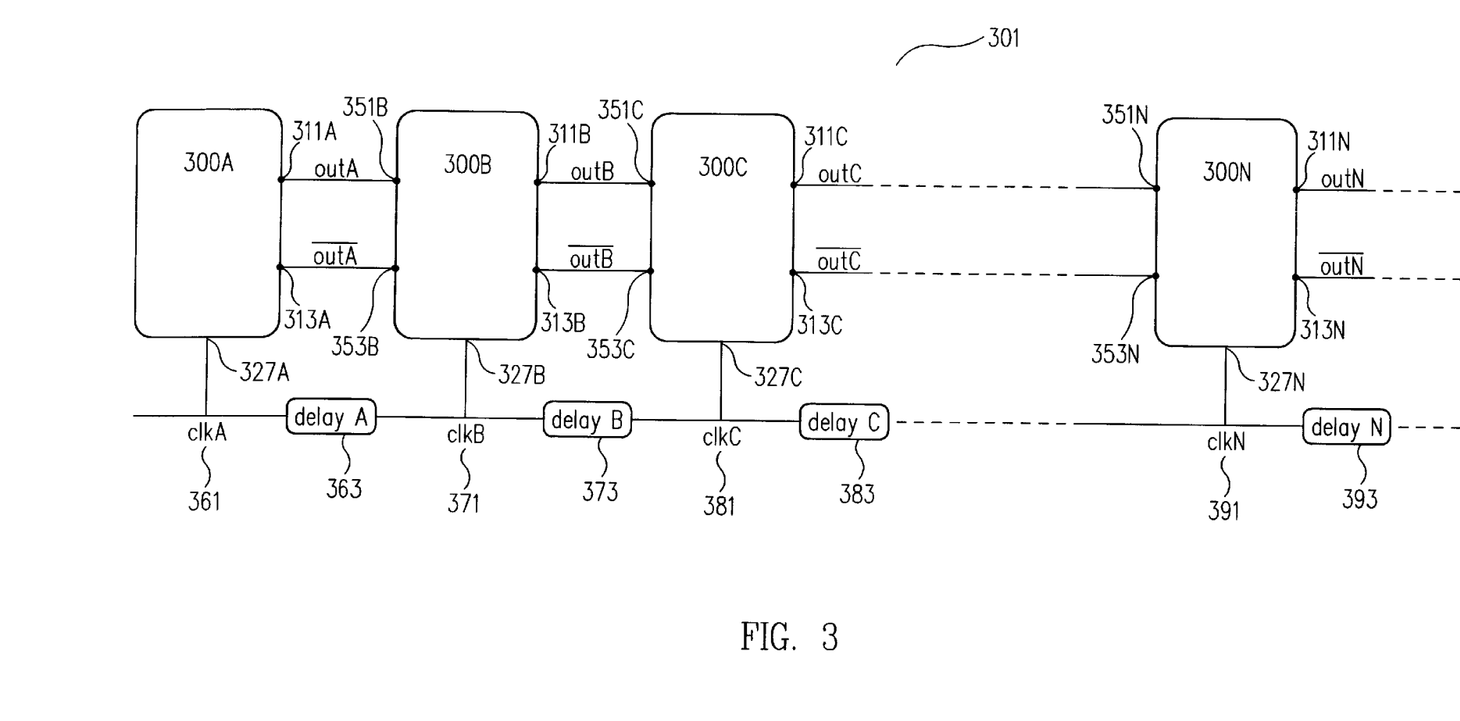
FIG. 3 shows one embodiment of a cascaded chain of clocked half-rail differential logic circuits according to the principles of the present invention.
Figure 4:
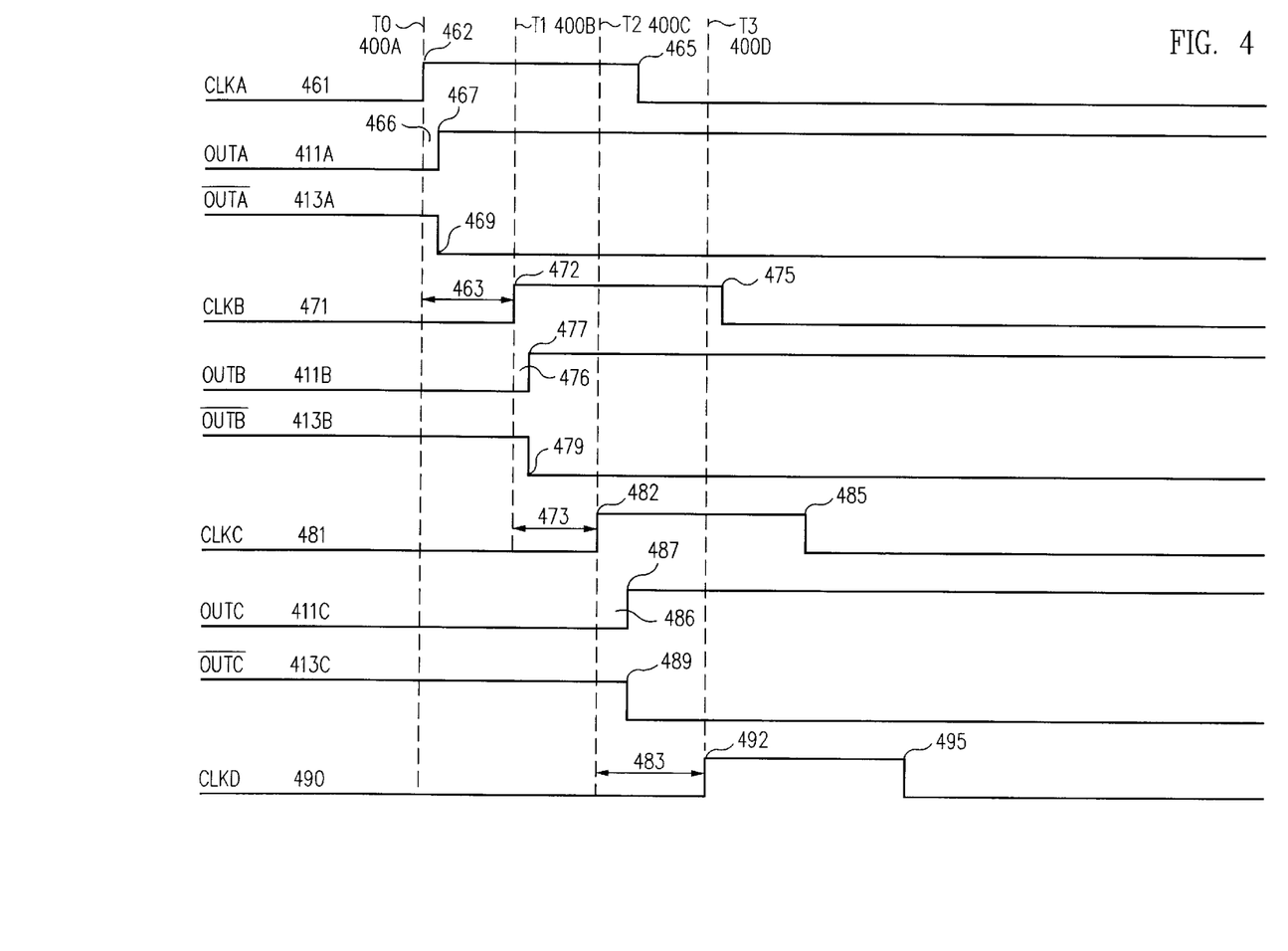
FIG. 4 is a one embodiment of a timing diagram for the cascaded chain of clocked half-rail differential logic circuits of the invention shown in FIG. 3.

According to the invention, the prior art control circuitry (100B in FIG. 1) is eliminated and the clocked half-rail differential logic circuits (200 in FIG. 2, 300A, 300B, 300C and 300N in FIG. 3 and 500 in FIG. 5) of the invention are activated instead from a delayed clock signal (CLKA 361, CLKB 371, CLKC 381 and CLKN 391 in FIG. 3 and CLKA 461, CLKB 471, CLKC 481 and CLKD 490 in FIG. 4).

According to the invention, when clocked half-rail differential logic circuits of the invention are cascaded together in a chain (301 in FIG. 3), a delayed clock signal is provided for each clocked half-rail differential logic circuit of the invention (300A, 300B, 300C and 300N in FIG. 3). The delayed clock signals are, according to the invention, timed to at least the delay of the previous clocked half-rail differential logic circuit. Consequently, according to the invention, a delay circuit (363, 373, 383 in FIG. 3) introduces a delay time (463, 473, and 483 in FIG. 4) between each clocked half-rail differential logic circuit of the invention to introduce a delay time and ensure each clocked half-rail differential logic circuit of the invention is switched or "fired" only after it has received an input from the previous clocked half-rail differential logic circuit.

According to the invention, clocked half-rail differential logic circuits do not require the significant additional components required in the prior art (control circuit 100B in FIG. 1). This, in turn, means that clocked half-rail differential logic circuits of the invention require less space, are simpler and have fewer components to potentially fail. In addition, clocked half-rail differential logic circuits of the invention also eliminate the loading of the output nodes (211 and 213 in FIG. 2, 311A, 313A, 311B, 313B, 311C, 313C, 311N and 313N in FIG. 3 and 511 and 513 in FIG. 5) of the half-rail differential logic circuit since there are no control signals (ein and $\overline{ein}$ in FIG. 1) and no prior art control circuits (100B in FIG. 1) to draw current from the output nodes to charge the control signals. Consequently, using the clocked half-rail differential logic circuits of the invention, speed is increased because there is less loading on the output nodes and the clocked half-rail differential logic circuits of the invention can start evaluating as soon as a differential voltage develops between the complementary inputs coming from the previous clocked half-rail differential logic circuit.

As a result, the clocked half-rail differential logic circuits of the invention are better suited to the present electronics market that stresses portability, compact size, lightweight and the capability for prolonged remote operation.

FIG. 2 shows a schematic diagram of one embodiment of a clocked half-rail differential logic circuit 200 designed according to the principles of the present invention. As seen in FIG. 2, according to the invention, a clock signal CLK is coupled to an input node 232 of a clock inverter 234 to yield a clock-not signal $\overline{CLK}$ at output node 236 of clock inverter 234.

As also seen in FIG. 2, clocked half-rail differential logic circuit 200 includes a first supply voltage 202 coupled to a source, or first flow electrode 230, of a PFET 201. The signal $\overline{CLK}$ is coupled to a control electrode or gate 203 of first PFET 201 and a control electrode or gate 229 of a first NFET 209. A drain, or second flow electrode 204, of first PFET 201 is coupled to both a source, or first flow electrode 206, of a second PFET 205 and a source, or first flow electrode 208, of a third PFET 207. A control electrode or gate 216 of second PFET 205 is coupled to a first flow electrode 240 of first NFET 209 and an out-not terminal 213. A control electrode or gate 214 of third PFET 207 is coupled to a second flow electrode 238 of first NFET 209 and an out terminal 211. A drain, or second flow electrode 210, of second PFET 205 is coupled to out terminal 211 and a drain, or second flow electrode 212, of third PFET 207 is coupled to out-not terminal 213.

Out terminal 211 is coupled to a first terminal 218 of a logic block 223 and out-not terminal 213 is coupled to a second terminal 220 of logic block 223. Logic block 223 includes any type of differential logic and/or circuitry used in the art including various logic gates, logic devices and circuits. Logic block 223 also includes first and second input terminals 251 and 253 that, as discussed in more detail below, are typically coupled to an out and out-not terminal of a previous clocked half-rail differential logic circuit stage (not shown).

Logic block 223 also includes third terminal 222 coupled to a drain, or first flow electrode 224, of a second NFET 225. A gate or control electrode 227 of second NFET 225 is coupled to the signal CLK and a source, or second flow electrode 226, of second NFET 225 is coupled to a second supply voltage 228.

A particular embodiment of a clocked half-rail differential logic circuit 200 according to the invention is shown in FIG. 2. Those of skill in the art will recognize that clocked half-rail differential logic circuit 200 can be easily modified. For example, different transistors, i.e., first, second and third PFETs 201, 205 and 207 or first and second NFETs 209 and 225 can be used. In particular, the NFETs and PFETS shown in FIG. 2 can be readily exchanged for PFETs and NFETs by reversing the polarities of the supply voltages 202 and 228, or by other well known circuit modifications. Consequently, the clocked half-rail differential logic circuit 200 that is shown in FIG. 2 is simply one embodiment of the invention used for illustrative purposes only and does not limit the present invention to that one embodiment of the invention.

Clocked half-rail differential logic circuit 200 has two modes, or phases, of operation; a pre-charge phase and an evaluation phase. In one embodiment of a clocked half-rail differential logic circuit 200 according to the invention, in the pre-charge phase, the signal CLK is low or a digital "0" and the signal $\overline{CLK}$ is high or a digital "1". Consequently, first PFET 201 and second NFET 225 are not conducting or are "off" and logic block 223 is isolated from first supply voltage 202 and second supply voltage 228. In addition, during the pre-charge phase, first NFET 209 is conducting or is "on" and, therefore, out terminal 211 is shorted to out-not terminal 213. Consequently, the supply voltage to logic block 223 is approximately half the supply voltage 202, i.e., for a first supply voltage 202 of Vdd and a second supply voltage 228 of ground, logic block 223 operates at around Vdd/2. During pre-charge, second and third PFETs 205 and 207 are typically not performing any function.

In one embodiment of a clocked half-rail differential logic circuit 200 according to the invention, in the evaluation phase, the signal CLK is high or a digital "1" and the signal $\overline{CLK}$ is low or a digital "0". Consequently, first PFET 201 and second NFET 225 are conducting or are "on" and first NFET 209 is not conducting or is "off". Consequently, depending on the particular logic in logic block 223, either second PFET 205, or third PFET 207, is conducting or is "on" and the other of second PFET 205, or third PFET 207, is not conducting or is "off". As a result, either out terminal 211 goes from approximately half first supply voltage 202 to approximately second supply voltage 228 or out-not terminal 213 goes from approximately half first supply voltage 202 to approximately first supply voltage 202, i.e., for a first supply voltage 202 of Vdd and a second supply voltage 228 of ground, out terminal 211 goes from approximately Vdd/2 to zero and out-not terminal 213 goes from approximately Vdd/2 to Vdd.

As discussed above, the method and apparatus of the invention for creating clocked half-rail differential logic circuits 200 does not require the complex control circuit 100B (FIG. 1) of prior art half-rail differential logic circuits 100A and is therefore simpler, saves space and is more reliable than prior art half-rail differential logic circuits 100A. As a result, the clocked half-rail differential logic circuits 200 (FIG. 2) of the invention are better suited to the present electronics market that stresses portability, compact size, lightweight and the capability for prolonged remote operation. However, as also discussed above, according to the invention, when clocked half-rail differential logic circuits 200 of the invention are cascaded together in a chain, a delayed clock signal must be provided for each clocked half-rail differential logic circuit 200 of the invention. The delayed clock signals are, according to the invention, timed to be at least the delay of the previous clocked half-rail differential logic circuit 200 to ensure each clocked half-rail differential logic circuit 200 of the invention is switched or "fired" only after it has received an input from the previous clocked half-rail differential logic circuit 200.

FIG. 3 shows one embodiment of a cascaded chain 301 of clocked half-rail differential logic circuits 300A, 300B 300C and 300N of the present invention. Each clocked half-rail differential logic circuit 300A, 300B, 300C and 300N represents a stage in cascaded chain 301. In one embodiment of the invention, each clocked half-rail differential logic circuit 300A, 300B 300C and 300N is identical to clocked half-rail differential logic circuit 200 discussed above with respect to FIG. 2.

As seen in FIG. 3, clocked half-rail differential logic circuit 300A includes: a clock input terminal 327A; an out terminal 311A; and an output-not terminal 313A. Clocked half-rail differential logic circuit 300B includes: a clock input terminal 327B; an input terminal 351B, coupled to output terminal 311A of clocked half-rail differential logic circuit 300A; an input-not terminal 353B, coupled to output-not terminal 313A of clocked half-rail differential logic circuit 300A; an output terminal 311B; and an output-not terminal 313A. Likewise, clocked half-rail differential logic circuit 300C includes: a clock input terminal 327C; an input terminal 351C, coupled to output terminal 311B of clocked half-rail differential logic circuit 300B; an input-not terminal 353C, coupled to output-not terminal 313B of clocked half-rail differential logic circuit 300B; an output terminal 311C; and an output-not terminal 313C. Clocked half-rail differential logic circuit 300N includes: a clock input terminal 327N; an input terminal 351N, coupled to an output terminal 311N−1 (not shown) of a clocked half-rail differential logic circuit 300N−1 (not shown); an input-not terminal 353N, coupled to an output-not terminal 313N−1 (not shown) of a clocked half-rail differential logic circuit 300N−1 (not shown); an output terminal 311N; and an output-not terminal 313N.

According to the invention, any number of clocked half-rail differential logic circuits 300A, 300B, 300C and 300N can be employed with cascaded chain 301. As also shown in FIG. 3, and discussed above, output terminal 311A of clocked half-rail differential logic circuit 300A couples signal OUTA to input terminal 351B of clocked half-rail differential logic circuit 300B and output-not terminal 313A of clocked half-rail differential logic circuit 300A couples signal $\overline{OUTA}$ to input-not terminal 353B of clocked half-rail differential logic circuit 300B. Likewise, output terminal 311B of clocked half-rail differential logic circuit 300B couples signal OUTB to input terminal 351C of clocked half-rail differential logic circuit 300C and output-not terminal 313B of clocked half-rail differential logic circuit 300B couples signal $\overline{OUTB}$ to input-not terminal 353C of clocked half-rail differential logic circuit 300C. In addition, output terminal 311N of clocked half-rail differential logic circuit 300N couples signal $\overline{OUTN}$ to an input terminal 351N+1 (not shown) of a clocked half-rail differential logic circuit 300N+1 (not shown) and output-not terminal 313N of clocked half-rail differential logic circuit 300N couples signal OUTN to an input-not terminal 353N+1 (not shown) of a clocked half-rail differential logic circuit 300N+1 (not shown).

In addition to the structure discussed above, according to the invention, each clocked half-rail differential logic circuit 300A, 300B, 300C and 306N of cascaded chain 301 receives its own delayed clock signal CLKA 361, CLKB 371, CLKC 381 and CLKN 391, respectively. According to the invention clock signals CLKA 361, CLKB 371, CLKC 381 and CLKN 391 are provided to clocked half-rail differential logic circuit 300A, 300B, 300C and 300N, respectively, by introducing delay circuits 363, 373, 383 and 393 between successive clocked half-rail differential logic circuits 300A, 300B, 300C and 300N. Consequently, delay circuit 363 introduces a delay time between signal CLKA 361, coupled to clock input terminal 327A of clocked half-rail differential logic circuit 300A, and signal CLKB 371, coupled to clock input terminal 327B of clocked half-rail differential logic circuit 300B. Delay circuit 373 introduces a delay time between signal CLKB 371 and signal CLKC 381, coupled to clock input terminal 327C of clocked half-rail differential logic circuit 300C. Two delay circuits 363 and 373 introduce two delay times between signal CLKA 361 and signal CLKC 381. Likewise, a series of N−1 delay circuits, and N−1 delay times, exists between signal CLKA 361 and signal CLKN 391, coupled to clock input terminal 327N of clocked half-rail differential logic circuit 300N, and a further delay circuit 393 introduces a further delay time between CLKN 391 and CLCK N+1 (not shown) coupled to a clock input terminal 327N+1 (not shown) of a clocked half-rail differential logic circuit 300N+1 (not shown).

Delay circuits 363, 373, 383 and 393 are any one of many delay circuits known in the art such as inverters, or groups of inverters, gates, transistors or any other elements that introduce a time delay. According to the invention, delay circuits 363, 373, 383 and 393 are used to ensure the activation of each stage, i.e., each clocked half-rail differential logic circuit 300A, 300B, 300C and 300N, is timed such that the delay of the clock is longer than the evaluation duration of the previous stage. In one embodiment of the invention, the delayed clock signals CLKA 361, CLKB 371, CLKC 381 and CLKN 391 are timed to switch high (active) when the differential input voltage to clocked half-rail differential logic circuit 300A, 300B, 300C and 300N reaches a predetermined voltage level. The clock delay can be adjusted according to the predetermined differential voltage level required for robustness and the specific needs of the circuit designer. This differential voltage level is typically a function of process and will vary from circuit to circuit and system to system. Importantly, however, using the method and structure of the invention, there is no need for the control signals ein and $\overline{\text{ein}}$ or control circuit 100B (FIG. 1).

FIG. 4 is one embodiment of a timing diagram for cascaded chain 301 of clocked half-rail differential logic circuits 300A, 300B, 300C and 300N of FIG. 3. As seen in FIG. 3 and FIG. 4 together, according to one embodiment of the invention, at time T0, i.e., point 400A in FIG. 4, signal CLKA 461 goes high. After a short switching delay 466, such as the short switching delay inherent in any circuit, signal OUTA 411A at output terminal 311A switches high and signal $\overline{\text{OUTA}}$ at output-not terminal 313A switches low at points 467 and 469, respectively. A delay time 463 from point T0 400A and to point T1 400B is introduced by delay circuit 363. As discussed above, delay time 463 helps ensure clocked half-rail differential logic circuit 300B receives signals OUTA and $\overline{\text{OUTA}}$ from clocked half-rail differential logic circuit 300A before the switching of signal CLKB 471.

At point 472 in FIG. 4, i.e., at point T1 400B, signal CLKB 471 switches high. After a short switching delay 476, signal OUTB 411B at output terminal 311B switches high and signal $\overline{\text{OUTA}}$ at output-not terminal 313B switches low at points 477 and 479, respectively. A delay time 473 from point T1 400B to point T2 400C is introduced by delay circuit 373. As discussed above, delay time 473 helps ensure clocked half-rail differential logic circuit 300C receives signals OUTB and $\overline{\text{OUTB}}$ from clocked half-rail differential logic circuit 300B before the switching of signal CLKC 481.

At point 482 in FIG. 4, i.e., at point T2 400C, signal CLKC 481 switches high. After a short switching delay 486, signal OUTC 411C at output terminal 311C switches high and signal $\overline{\text{OUTA}}$ at output-not terminal 313C switches low at points 487 and 489, respectively. A delay time 483 from point T2 400C to point T3 400D is introduced by delay circuit 383. As discussed above, delay time 483 helps ensure the following clocked half-rail differential logic circuit (not shown) receives signals OUTC and $\overline{\text{OUTC}}$ from clocked half-rail differential logic circuit 300C before the switching of signal CLKD 490.

At point 492 in FIG. 4, i.e., at point T3 400D, signal CLKD 491 switches high. As discussed above, according to the invention, any number of clocked half-rail differential logic circuits 300A, 300B, 300C and 300N can be employed with cascaded chain 301. In addition, the process discussed above will repeat for each switching of the system clock. Those of skill in the art will further recognize that the choice of signal highs and signal lows was made arbitrarily in FIG. 4 for illustrative purposes only and that at other times, and in other embodiments of the invention, signal highs could be replaced with signal lows and vice-versa.

Figure 5:
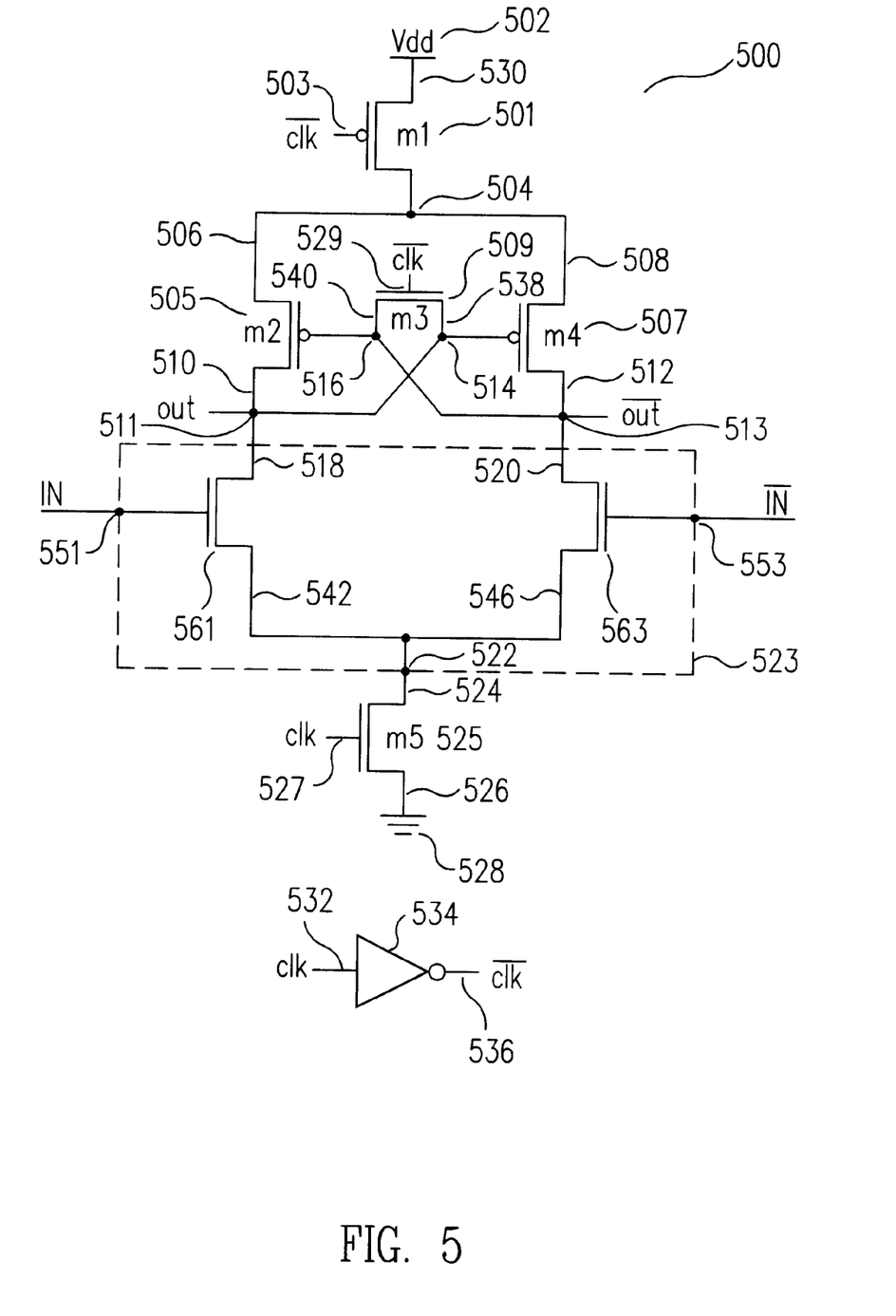
FIG. 5 shows a schematic diagram of one embodiment of a clocked half-rail differential logic circuit designed according to the principles of the present invention that includes an inverter as the differential logic.

FIG. 5 shows a schematic diagram of one embodiment of a clocked half-rail differential logic circuit 500 designed according to the principles of the present invention that includes an inverter 523. As seen in FIG. 5, according to the invention, a clock signal CLK is coupled to an input node 532 of a clock inverter 534 to yield a clock-not signal $\overline{\text{CLK}}$ at output node 536 of clock inverter 534.

As also seen in FIG. 5, clocked half-rail differential logic circuit 500 includes a first supply voltage 502 coupled to a source, or first flow electrode 530, of a PFET 501. The signal $\overline{\text{CLK}}$ is coupled to a control electrode or gate 503 of first PFET 501 and a control electrode or gate 529 of a first NFET 509. A drain, or second flow electrode 504, of first PFET 501 is coupled to both a source, or first flow electrode 506, of a second PFET 505 and a source, or first flow electrode 508, of a third PFET 507. A control electrode or gate 516 of second PFET 505 is coupled to a first flow electrode 540 of first NFET 509 and an out-not terminal 513. A control electrode or gate 514 of third PFET 507 is coupled to a second flow electrode 538 of first NFET 509 and an out terminal 511. A drain, or second flow electrode 510, of second PFET 505 is coupled to out terminal 511 and a drain, or second flow electrode 512, of third PFET 507 is coupled to out-not terminal 513.

Out terminal 511 is coupled to a drain, or first flow electrode 518, of a first inverter NFET 561 and out-not terminal 513 is coupled to a drain, or first flow electrode 520, of a second inverter NFET 563. A gate or control electrode 551 of first inverter NFET 561 is coupled to receive an IN signal, typically from a previous stage in a cascade chain, such as cascade chain 301 discussed above, and a gate or control electrode 553 of second inverter NFET 563 is coupled to receive an $\overline{\text{IN}}$ signal, also typically from a previous stage in a cascade chain, such as cascade chain 301 discussed above. The sources, or second flow electrodes 542 and 546, of first inverter NFET 561 and second inverter NFET 563, respectively, are coupled and to a junction 522.

Junction 522 is coupled to a drain, or first flow electrode 524, of a second NFET 525. A gate or control electrode 527 of second NFET 525 is coupled to the signal CLK and a source, or second flow electrode 526, of second NFET 525 is coupled to a second supply voltage 528.

A particular embodiment of a clocked half-rail differential logic circuit 500 according to the invention is shown in FIG. 5. Those of skill in the art will recognize that clocked half-rail differential logic circuit 500 can be easily modified. For example, different transistors, i.e., first, second and third PFETs 501, 505 and 507 or first and second NFETs 509 and 525 can be used. In particular, the NFETs and PFETS shown in FIG. 5 can be readily exchanged for PFETs and NFETs by reversing the polarities of the supply voltages 502 and 528, or by other well known circuit modifications. Consequently, the clocked half-rail differential logic circuit 500 that is shown in FIG. 5 is simply one embodiment of the invention used for illustrative purposes only and does not limit the present invention to that one embodiment of the invention.

As with clocked half-rail differential logic circuit 200, discussed above with respect to FIG. 2, clocked half-rail differential logic circuit 500 has two modes, or phases, of operation; a pre-charge phase and an evaluation phase. In one embodiment of a clocked half-rail differential logic circuit 500 according to the invention, in the pre-charge phase, the signal CLK is low or a digital "0" and the signal $\overline{\text{CLK}}$ is high or a digital "1". Consequently, first PFET 501 and second NFET 525 are not conducting or are "off" and inverter 523 is isolated from first supply voltage 502 and second supply voltage 528. In addition, during this pre-charge phase, first NFET 509 is conducting or is "on" and, therefore, out terminal 511 is shorted to out-not terminal 513. Consequently, the supply voltage to inverter 523 is approximately half the supply voltage 502, i.e., for a first supply voltage 502 of Vdd and a second supply voltage 528 of ground, inverter 523 operates at around Vdd/2. During pre-charge, second and third PFETs 505 and 507 are typically not performing any function.

In one embodiment of a clocked half-rail differential logic circuit 500 according to the invention, in the evaluation phase, the signal CLK is high or a digital "1" and the signal $\overline{CLK}$ is low or a digital "0". Consequently, first PFET 501 and second NFET 525 are conducting or are "on" and first NFET 509 is not conducting or is "off". Consequently, depending on the particular logic in logic block 523, either second PFET 505, or third PFET 507, is conducting or is "on" and the other of second PFET 505, or third PFET 507, is not conducting or is "off". As a result, either out terminal 511 goes from approximately half first supply voltage 502 to approximately second supply voltage 528 or out-not terminal 513 goes from approximately half first supply voltage 502 to approximately first supply voltage 502, i.e., for a first supply voltage 502 of Vdd and a second supply voltage 528 of ground, out terminal 511 goes from about Vdd/2 to zero and out-not terminal 513 goes from about Vdd/2 to Vdd.

When signal IN at gate 551 of first inverter NFET 561 is low, first inverter NFET 561 does not conduct and signal OUT at out terminal 511 is high. When signal IN at gate 551 of first inverter NFET 561 is high, first inverter NFET 561 conducts and signal OUT at out terminal 511 is low. Likewise, when signal $\overline{IN}$ at gate 553 of second inverter NFET 563 is low, i.e., when signal IN at gate 551 of first inverter NFET 561 is high, second inverter NFET 563 does not conduct and signal $\overline{OUT}$ at out-not terminal 513 is high. When signal $\overline{IN}$ at gate 553 of second inverter NFET 563 is high, first inverter NFET 563 conducts and signal $\overline{OUT}$ at out-not terminal 513 is low. Consequently, Inverter 523 of clocked half-rail differential logic circuit 500 in FIG. 5 produces the expected 180-degree polarity shift.

As shown above, according to the invention, the prior art control circuitry is eliminated and the clocked half-rail differential logic circuits of the invention are activated instead from a delayed clock signal. According to the invention, when clocked half-rail differential logic circuits of the invention ate cascaded together in a chain, a delayed clock signal is provided for each clocked half-rail differential logic circuit of the invention. The delayed clock signals are, according to the invention, timed to be at least the delay of the previous clocked half-rail differential logic circuit. Consequently, according to the invention, a delay time is introduced to ensure each clocked half-rail differential logic circuit of the invention is switched or "fired" only after it has received an input from the previous clocked half-rail differential logic circuit stage.

According to the invention, clocked half-rail differential logic circuits do not require the significant additional components required in the prior art. This, in turn, means that clocked half-rail differential logic circuits of the invention require less space, are simpler to implement and employ and have fewer components to potentially fail. In addition, clocked half-rail differential logic circuits of the invention also eliminate the loading of the output nodes of the half-rail differential logic circuit since there are no control signals, and no prior art control circuits, to draw current from the output nodes to charge the control signals. Consequently, using the clocked half-rail differential logic circuits of the invention, speed is increased because there is less loading on the output nodes and the clocked half-rail differential logic circuits of the invention can start evaluating as soon as a differential voltage develops between the complementary inputs coming from the previous clocked half-rail differential logic circuit.

As a result, the clocked half-rail differential logic circuits of the invention are better suited to the present electronics market that stresses portability, compact size, lightweight and the capability for prolonged remote operation.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

For example, for illustrative purposes specific embodiments of the invention were shown with specific transistors. However, the NFETs and PFETS shown in the figures can be readily exchanged for PFETs and NFETs by reversing the polarities of the supply voltages or by other well known circuit modifications.

Consequently, the scope of the invention is defined by the claims and their equivalents.

What is claimed is:

1. A method for creating a cascaded chain synchronous clocked half-rail differential logic circuits said method comprising:
   providing a first synchronous clocked half-rail differential logic circuit, said first clocked half-rail differential logic circuit comprising:
      a first synchronous clocked half-rail differential logic circuit clock input terminal;
      at least one first synchronous clocked half-rail differential logic circuit data input terminal; and
      at least one first synchronous clocked half-rail differential logic circuit data output terminal;
   providing a second synchronous clocked half-rail differential logic circuit, said second synchronous clocked half-rail differential logic circuit comprising:
      a second synchronous clocked half-rail differential logic circuit clock input terminal;
      at least one second synchronous clocked half-rail differential logic circuit data input terminal; and
      at least one second synchronous clocked half-rail differential logic circuit data output terminal;
   coupling a first clock signal to said first synchronous clocked half-rail differential logic circuit clock input terminal;
   coupling a second clock signal to said second synchronous clocked half-rail differential logic circuit clock input terminal;
   coupling said at least one first synchronous clocked half-rail differential logic circuit data output terminal to said at least one second synchronous clocked half-rail differential logic circuit data input terminal; and
   delaying said second clock signal with respect to said first clock signal by a predetermined delay time.

2. The method of claim 1 further comprising:
   coupling a delay circuit between said first synchronous clocked half-rail differential logic circuit clock input terminal and said second synchronous clocked half-rail differential logic circuit clock input terminal for delaying said second clock signal with respect to said first clock signal by said predetermined delay time.

3. The method of claim 2, wherein;
   said delay circuit comprises at least one inverter.

4. The method of claim 2, wherein;
   said delay circuit comprises at least two inverters.

* * * * *